United States Patent
Chang

(10) Patent No.: US 8,625,065 B2
(45) Date of Patent: Jan. 7, 2014

(54) ARRAY SUBSTRATE AND DISPLAY PANEL HAVING THE SAME

(75) Inventor: Jong-Woong Chang, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 778 days.

(21) Appl. No.: 12/197,041

(22) Filed: Aug. 22, 2008

(65) Prior Publication Data

US 2009/0122247 A1 May 14, 2009

(30) Foreign Application Priority Data

Nov. 14, 2007 (KR) .......................... 10-2007-0115836

(51) Int. Cl.
*G02F 1/1343* (2006.01)

(52) U.S. Cl.
USPC ......................................................... 349/141

(58) Field of Classification Search
None
See application file for complete search history.

(56) References Cited

U.S. PATENT DOCUMENTS

| | | | |
|---|---|---|---|
| 6,069,678 A * | 5/2000 | Sakamoto et al. ............ | 349/141 |
| 6,486,933 B1 * | 11/2002 | Cha et al. ...................... | 349/139 |
| 6,784,965 B2 * | 8/2004 | Kim et al. ...................... | 349/141 |
| 2006/0146255 A1 * | 7/2006 | Ahn .............................. | 349/141 |
| 2007/0216842 A1 * | 9/2007 | Kawasaki et al. ............. | 349/141 |
| 2008/0002126 A1 * | 1/2008 | Lim et al. ...................... | 349/141 |
| 2008/0074572 A1 * | 3/2008 | Kim et al. ...................... | 349/44 |
| 2008/0284962 A1 * | 11/2008 | Horiguchi et al. ............ | 349/139 |

* cited by examiner

*Primary Examiner* — Thanh-Nhan P Nguyen
(74) *Attorney, Agent, or Firm* — Innovation Counsel LLP

(57) ABSTRACT

An array substrate includes a gate line, a data line, a plurality of common electrodes, a shield electrode, and a pixel electrode. The gate line is extended along a first direction, and the data line is extended along a second direction. The common electrodes are formed in a plurality of pixel areas. The common electrodes are spaced apart from each other. The shield electrode is formed below the data line and formed between the common electrodes formed in the pixel areas adjacent to each other. The pixel electrode is overlapped with the common electrodes. The pixel electrode has a plurality of openings formed thereon. Therefore, an electric field of a common electrode pattern may prevent coupling between a pixel electrode and a data line, so that a distance between the pixel electrode and the data line may be minimized, and thus an aperture ratio and light transmittance may be enhanced.

31 Claims, 15 Drawing Sheets

ARRAY SUBSTRATE AND DISPLAY PANEL HAVING THE SAME

CROSS-REFERENCE TO RELATED APPLICATIONS

This application claims priority under 35 U.S.C. §119 to Korean Patent Application No. 10-2007-115836, filed on Nov. 14, 2007 in the Korean Intellectual Property Office (KIPO), the contents of which are herein incorporated by reference in their entirety.

BACKGROUND OF THE INVENTION

1. Field of the Invention

The present invention relates to an array substrate and a display panel having the array substrate. More particularly, the present invention relates to an array substrate having an enhanced aperture ratio and enhanced light transmittance and a display panel having the array substrate.

2. Description of the Related Art

In order to realize wide viewing angles in liquid crystal display (LCD) devices, in-plane switching (IPS) mode LCD devices and fringe-field switching (FFS) mode LCD devices have been developed. In the IPS mode LCD device, a pixel electrode and a common electrode are formed on a single substrate so that a horizontal electric field (or a transverse electric field) formed between the two electrodes can control a liquid crystal director. In a IPS mode LCD device, liquid crystal molecules rotate in a plane substantially parallel to an alignment layer of a substrate. Therefore, the difference in refractive index anisotropy is small when viewed by a viewer, and a liquid crystal layer includes liquid crystal molecules having two rotation directions opposite to each other when viewed from a cross-sectional view which compensates a phase difference of light to realize a wide viewing angle.

A FFS mode LCD device uses a transverse electric field and is substantially identical with a IPS mode LCD device in terms of how the liquid crystal molecules are arranged using the transverse electric field. However, the pixel electrode and the common electrode are formed on different layers in a FFS mode LCD device, so that a FFS mode LCD device arranges liquid crystal molecules using both a horizontal electric field and a vertical electric field.

A FFS mode LCD device arranges liquid crystal molecules using the vertical electric field, so that the light transmittance of a FFS mode LCD device is superior to that of a IPS mode LCD device. Moreover, liquid crystal molecules of a FFS mode LCD device are moved in a substantially horizontal direction, so that the viewing angle of a FFS mode LCD device is substantially identical to that of a IPS mode LCD device. Furthermore, the aperture ratio of a FFS mode LCD device is superior to that of a IPS mode LCD device.

SUMMARY OF THE INVENTION

The present invention provides an array substrate having an enhanced aperture ratio and enhanced light transmittance.

The present invention also provides a display panel having the above-mentioned array substrate.

In one aspect of the present invention, an array substrate includes a gate line, a data line, a plurality of common electrodes, a shield electrode, and a pixel electrode. The gate line is extended along a first direction on a base substrate. The data line is extended along a second direction crossing the first direction. The common electrodes are formed in a plurality of pixel areas of the base substrate. The common electrodes are spaced apart from each other. The shield electrode is formed below the data line and between the common electrodes formed in the pixel areas adjacent to each other. The shield electrode receives the same voltage as the voltage applied to the common electrodes. The pixel electrode is overlapped by the common electrodes. The pixel electrode has a plurality of openings formed thereon.

In another aspect of the present invention, a display panel includes an array substrate and an opposite substrate. The array substrate includes a gate line, a data line, a plurality of common electrodes, a shield electrode and a pixel electrode. The gate line is extended along a first direction on a base substrate. The data line is extended along a second direction crossing the first direction. The common electrodes are formed in a plurality of pixel areas of the base substrate. The common electrodes are spaced apart from each other. The shield electrode is formed below the data line and between the common electrodes formed in the pixel areas adjacent to each other. The shield electrode receives the same voltage as the voltage applied to the common electrodes. The pixel electrode is overlapped with the common electrodes. The pixel electrode has a plurality of openings formed thereon. The opposite substrate is coupled to the array substrate.

According to an array substrate and a display panel having the array substrate, an electric field of a common electrode pattern may prevent coupling between a pixel electrode and a data line, so that a distance between the pixel electrode and the data line may be minimized, and thus an aperture ratio and light transmittance may be enhanced.

BRIEF DESCRIPTION OF THE DRAWINGS

The above and other advantages of the present invention will become readily apparent by reference to the following detailed description when considered in conjunction with the accompanying drawings wherein.

DESCRIPTION OF THE EMBODIMENTS

Figure 1:
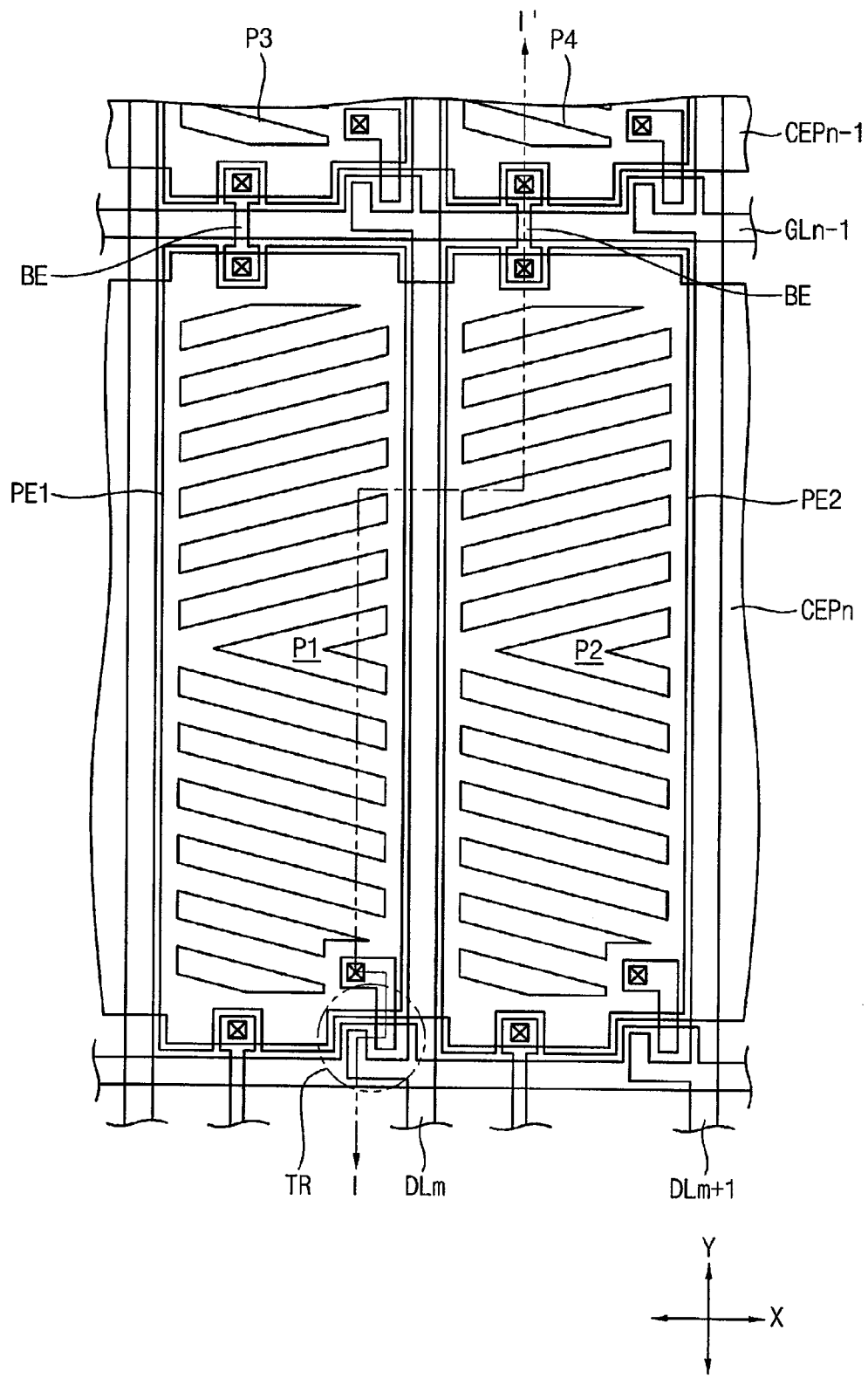
FIG. 1 is a plan view illustrating a display panel according to one embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Embodiment 1

Figure 2:
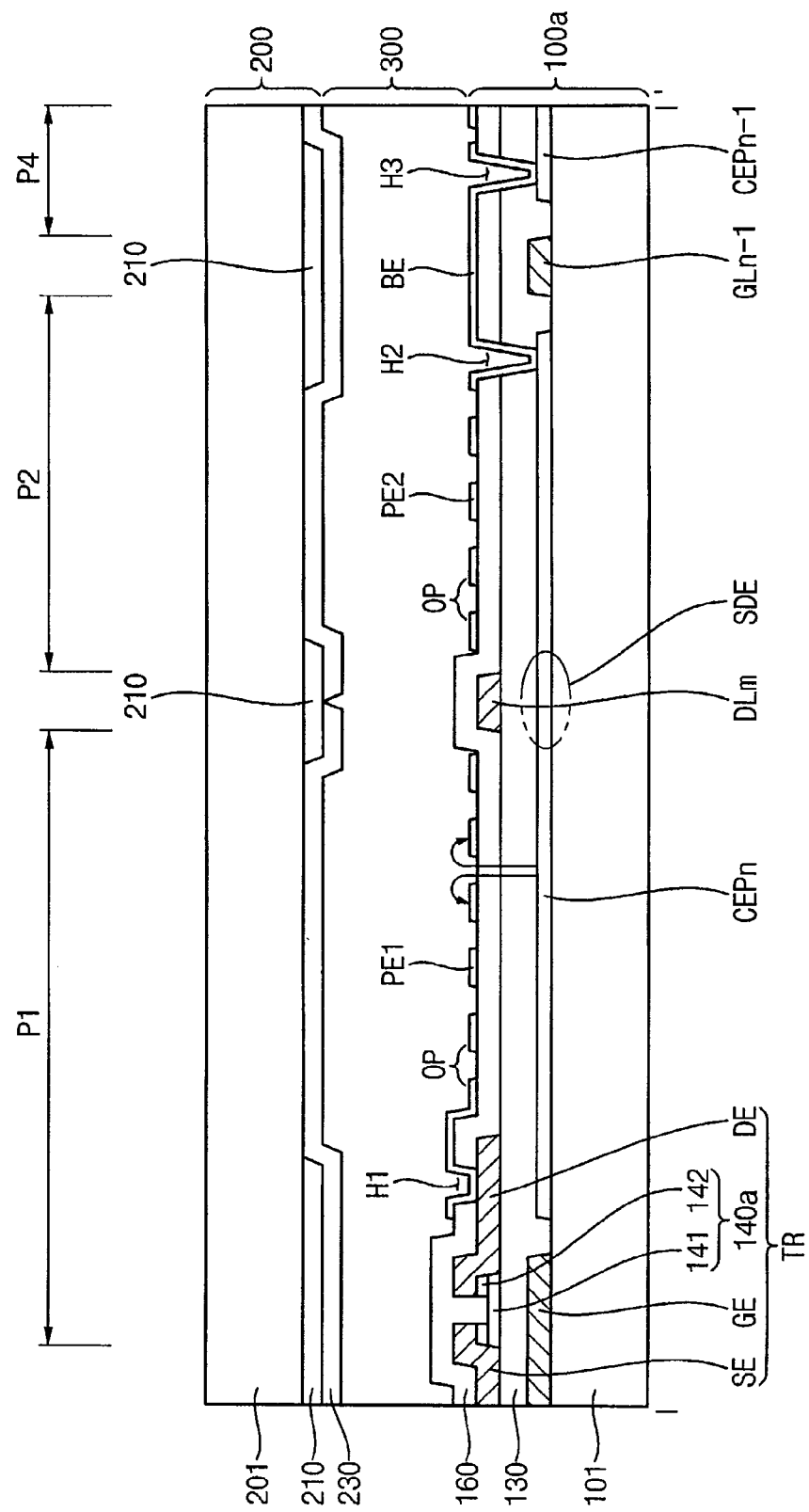
FIG. 2 is a cross-sectional view taken along a line I-I' of FIG. 1.

FIG. 1 is a plan view illustrating a display panel according to Embodiment 1 of the present invention. FIG. 2 is a cross-sectional view taken along a line I-I' of FIG. 1.

Referring to FIGS. 1 and 2, a display panel includes an array substrate 100a, an opposite substrate 200 and a liquid crystal layer 300 interposed between the array substrate 100a and the opposite substrate 200.

The array substrate 100a includes a first base substrate 101. The first base substrate 101 includes an optically transparent and electrically non-conductive material such as glass. A plurality of pixel areas is defined in the first base substrate 101. A plurality of gate lines GLn−1 and Gn extending along a first direction 'X' and a plurality of data lines DLm and DLm+1 extending along a second direction 'Y' crossing the first direction 'X' are formed on the first base substrate 101. A switching element, a pixel electrode and a common electrode are formed in each of the pixel areas. Here, 'n' and 'm' are natural numbers.

For example, a switching element TR, a pixel electrode PE and a common electrode pattern CEPn may be formed in the pixel area P1. The switching element TR is electrically connected to an (n)-th gate line GLn and an (m)-th data line DLm, and the pixel electrode PE is electrically connected to the switching element TR. The (n)-th common electrode pattern CEPn is overlapped by the pixel electrode PE and formed below the pixel electrode PE.

The switching element TR includes a gate electrode GE extending from the (n)-th gate line GLn, a source electrode SE extending from the (m)-th data line DLm, and a drain electrode DE spaced apart from the source electrode SE to be electrically connected to the source electrode SE through a channel part 140a.

The (n)-th gate line GLn and the gate electrode GE are a first metal pattern formed by patterning a first metal layer. A gate insulation layer 130 is formed on the gate line GL and the gate electrode GE. The channel part 140a includes a semiconductor layer 141 and an ohmic contact layer 142 formed on the semiconductor layer 141. The semiconductor layer 141 includes amorphous silicon. The ohmic contact layer 142 includes amorphous silicon doped with n+ ions at a high concentration. The (m)-th data line DLm, the source electrode SE and the drain electrode DE are a second metal pattern formed by patterning a second metal layer.

The pixel electrode PE is electrically connected to a drain electrode DE of the switching element TR through a first contact hole H1. That is, a passivation film 160 having a first contact hole H1 formed thereon is formed on the switching element TR. The pixel electrode PE has a plurality of openings OP formed thereon. The openings OP may be separated from each other. In this embodiment, the openings OP are formed in a V-shape along the first direction 'X'. Alternatively, the openings OP may have other shapes, such as a V-shape, along the second direction 'Y'. Alternatively, the openings OP may be formed through the pixel electrode PE in a direction parallel with the first and second directions 'X' and 'Y'.

The (n)-th common electrode pattern CEPn is formed in the pixel areas P1 and P2 that are arranged in the first direction 'X' to be overlapped with the first and second pixel electrodes PE1 and PE2. The (n)-th common electrode pattern CEPn is formed in parallel with the (n)-th gate line GLn. The (n−1-th common electrode pattern CEPn is formed in parallel with the (n−1)-th gate line GLn−1 to be overlapped with pixel electrodes (not shown) electrically connected to the (n−1)-th gate line GLn−1. As a result, the data lines DLm and DLm+1 which extend along the second direction 'Y' are formed to cross the (n)-th common electrode pattern CEPn. A portion of the (n)-th common electrode pattern CEPn crossed with the data lines DLm and DLm+1 may function as a shield electrode SDE.

An electric field formed at the shield electrode SDE may prevent coupling between the (m)-th data line DLm and the pixel electrode PE, so that a coupling capacitance between the (m)-th data line DLm and the first pixel electrode PE1 may be reduced. Therefore, the first pixel electrode PE1 is extended to an area adjacent to the (m)-th data line DLm, so that an aperture ratio of the display panel may be enhanced.

The (n)-th common electrode pattern CEPn and the (n−1)-th common electrode pattern CEPn−1 are electrically connected to a plurality of bridge electrodes BE. Each of the bridge electrodes BE makes contact with the common electrode patterns CEPn and CEPn−1 through the second contact holes H2 and H3 formed through the gate insulation layer 130 and the passivation film 160.

The gate insulation layer 130 and the passivation film 160 are formed between the (n)-th common electrode pattern CEPn and the first pixel electrode PE1. When a voltage is applied to the (n)-th common electrode pattern CEPn and the first pixel electrode PE1, a vertical electric field and a horizontal electric field are produced. Thus, an arrangement angle of liquid crystal molecules is adjusted by the vertical and horizontal electric fields, so that light transmittance may be controlled.

A switching element, a common electrode pattern and a pixel electrode are formed in a plurality of pixel areas P2, P3 and P4, respectively.

The opposite substrate 200 includes a second base substrate 201, a light-blocking pattern 210 formed on the second base substrate 201 and a color filter 230 in correspondence with the pixel areas. The second base substrate 201 may include an optically transparent material such as a glass substrate.

The light-blocking pattern 210 is formed on the second base substrate 201 in correspondence with the gate lines GLn−1 and GLn and the data lines DLm and DLm+1.

The light-blocking pattern 210 may be removed corresponding to an area where the data lines DLm and DLm+1 are formed. When the common electrode patterns CEPn−1 and CEPn are formed below the data lines DLM and DLm+1, light incident from a rear surface of the first base substrate 101 may be shielded by the common electrode patterns CEPn−1 and CEPn. Therefore, the light-blocking pattern 210 may be removed in correspondence with the data lines DLm and DLm+1.

The color filter 230 is formed in correspondence with each of the pixel areas of the array substrate 100a. The color filter 230 may include a red filter, a green filter and a blue filter.

FIGS. 3A to 3G are cross-sectional views and plan views illustrating a method of manufacturing an array substrate of FIG. 2.

Figure 3A:
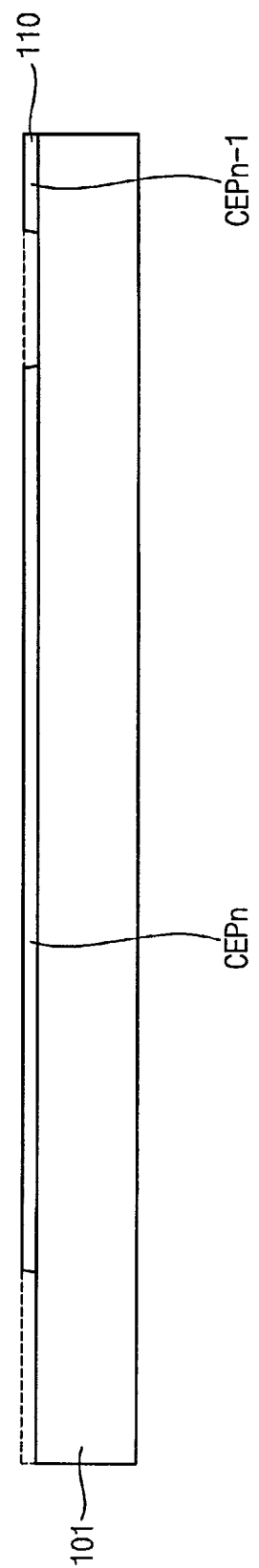
FIGS. 3A to 3G are cross-sectional views and plan views illustrating a method of manufacturing an array substrate of FIG. 2.

Referring to FIGS. 1 and 3A, a first transparent conductive layer 110 is formed on a base substrate 101. The first transparent conductive layer 110 may include an optically transparent and electrically conductive material such as indium tin oxide (ITO), indium zinc oxide (IZO), amorphous indium tin oxide (a-ITO), etc.

The first transparent conductive layer 110 is patterned using a photoresist pattern to form a plurality of common electrode patterns CEPn−1 and CEPn that is extended along a first direction 'X'.

Figure 3B:
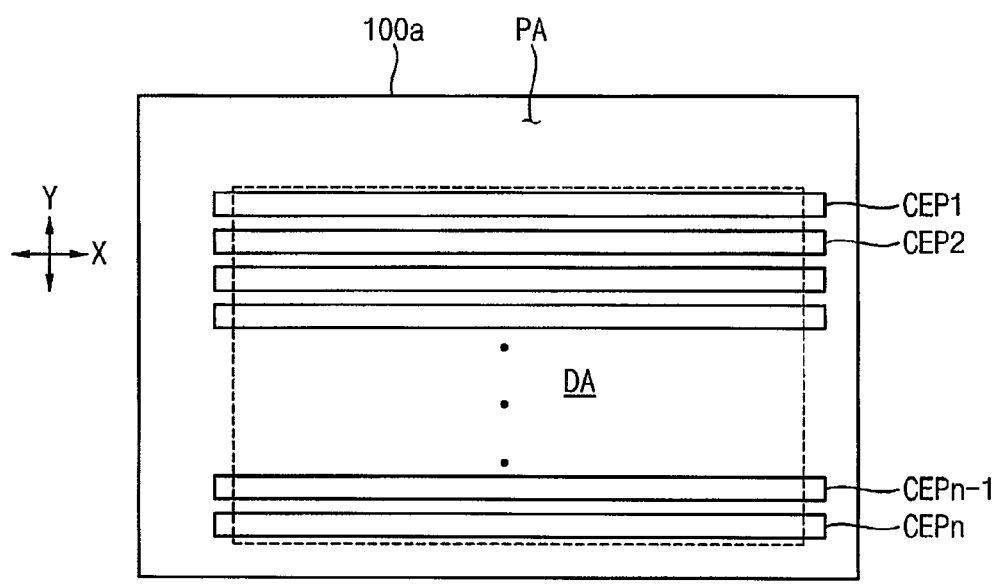

Referring to FIG. 3B, an array substrate 100a includes a display area DA having a plurality of pixel areas defined thereon, and a peripheral area PA that surrounds the display area DA. The common electrode patterns CEP1, CEP2, . . . , CEPn−1 and CEPn are formed on the pixel areas arranged on the display area DA along the first direction 'X'. A plurality of pixel electrodes, which is electrically connected to a predetermined gate line, is formed on the pixel areas arranged in the first direction 'X' by using a following manufacturing process.

Figure 3C:
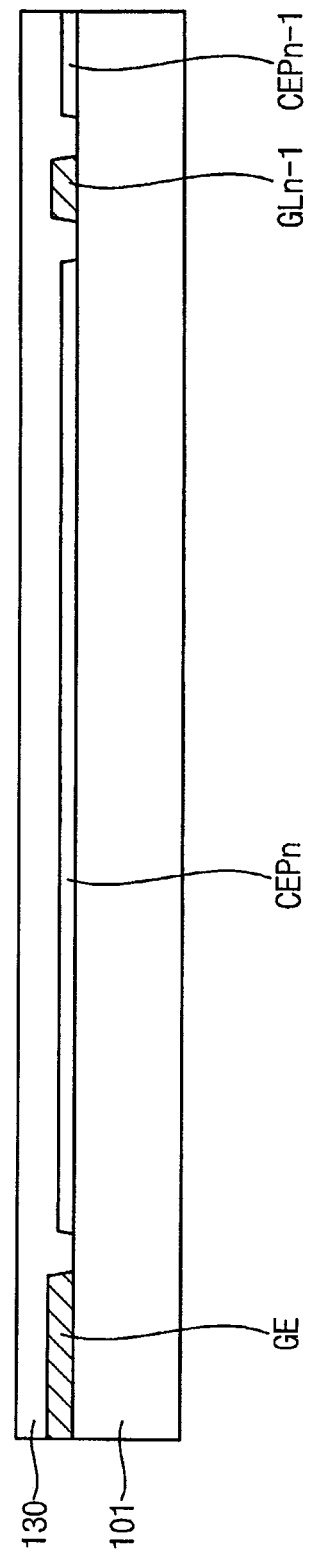

Referring to FIGS. 1 and 3C, a first metal layer (not shown) is formed on the base substrate 101 having the common electrode patterns CEPn−1 and CEPn. The first metal layer may include an aluminum (Al) series metal such as aluminum, aluminum alloy, etc., a molybdenum (Mo) series metal such as molybdenum, molybdenum alloy, etc., and a metal including chromium (Cr), tantalum (Ta), titanium (Ti), tungsten (W), silver (Ag), copper (Cu), an alloy thereof, etc. The first metal layer may include a single-layer structure or a multilayer structure. In one example, the first metal layer may include molybdenum (Mo), molybdenum tantalum (MoTa), molybdenum tungsten (MoW) and aluminum nickel (AlNi). In another example, the first metal layer may include molybdenum (Mo), and aluminum (Al) that is sequentially formed on the molybdenum (Mo). In still another example, the first metal layer may include titanium (Ti), and aluminum (Al) that is sequentially formed on the titanium (Ti). In further still another example, the first metal layer may include molybdenum (Mo), aluminum (Al) that is sequentially formed on the molybdenum (Mo), and molybdenum (Mo) that is sequentially formed on the aluminum (Al).

The first metal layer is patterned using a photoresist pattern to form a first metal pattern. The first metal pattern includes the gate lines GLn−1 and GLn and a gate electrode GE of the switching element TR. A gate insulation layer 130 is formed on the base substrate 101 having the first metal pattern.

Figure 3D:
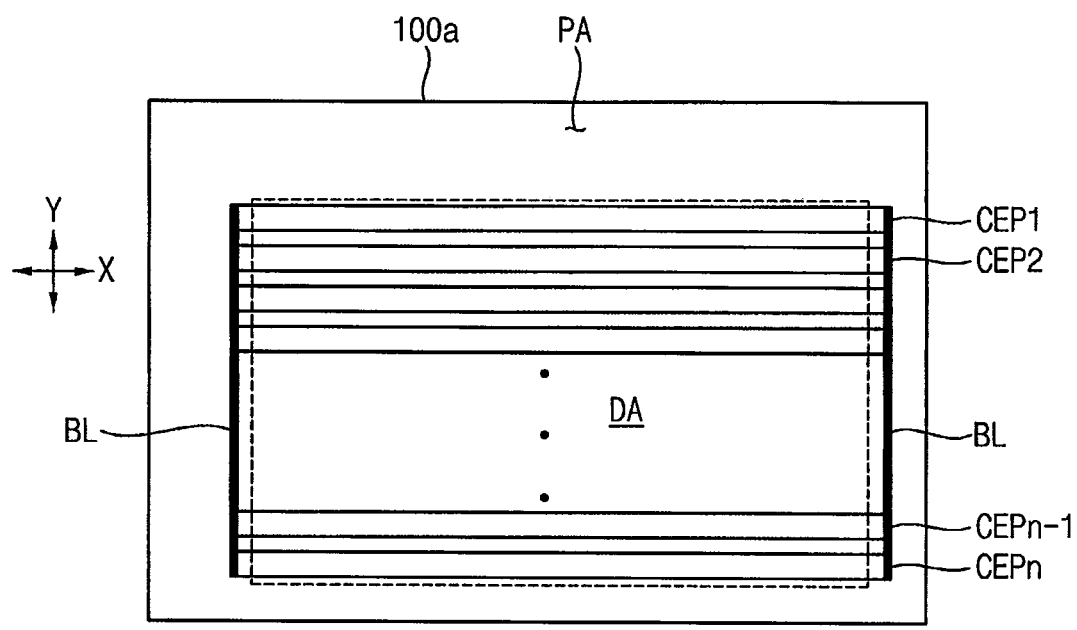

Referring to FIG. 3D, the first metal pattern may include a bridge line BL. The bridge line BL extends along the second direction 'Y' crossing the first direction 'X' to make contact with edge portions of the common electrode patterns CEP1, CEP2, . . . , CEPn−1 and CEPn, wherein 'n' is a natural number. A common voltage is applied to the common electrode patterns CEP1, CEP2, . . . , CEPn−1 and CEPn through the bridge line BL.

In this embodiment, the bridge line BL is formed from the first metal layer. Alternatively, the bridge line BL may be formed from a second metal layer that is described below. Furthermore, the bridge line BL may be formed from a second transparent conductive layer which forms the first pixel electrode PE1.

Figure 3E:
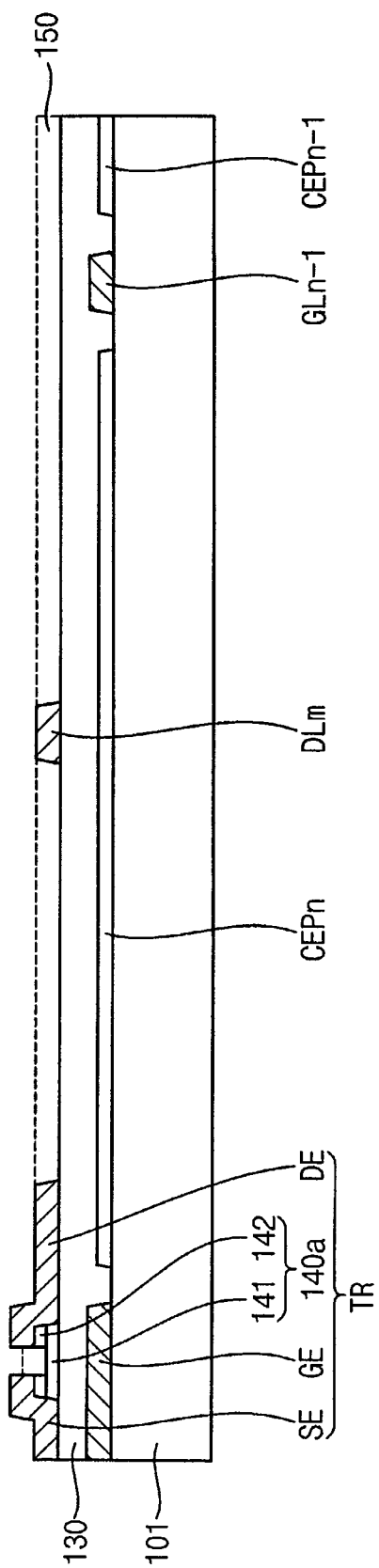

Referring to FIGS. 1 and 3E, a channel layer (not shown) is formed on the base substrate 101 having the gate insulation layer 130, and the channel layer is patterned using a photoresist pattern to form a channel part 140a of the island-shaped switching element TR. The channel layer includes a semiconductor layer 141 and an ohmic contact layer 142 formed on the semiconductor layer 141. The semiconductor layer 141 includes amorphous silicon. The ohmic contact layer 142 includes amorphous silicon doped with n+ ions at a high concentration.

A second metal layer 150 is formed on the base substrate 101 having the channel part 140a. The second metal layer 150 may include an aluminum (Al) series metal such as aluminum, aluminum alloy, etc., a molybdenum (Mo) series metal such as molybdenum, molybdenum alloy, etc., and a metal including chromium (Cr), tantalum (Ta), titanium (Ti), tungsten (W), silver (Ag), copper (Cu), an alloy thereof, etc. The second metal layer 150 may include a single-layer structure or a multilayer structure. In one example, the second metal layer 150 may include molybdenum (Mo), molybdenum tantalum (MoTa), molybdenum tungsten (MoW) and aluminum nickel (AlNi). In another example, the second metal layer 150 may include molybdenum (Mo), and aluminum (Al) that is sequentially formed on the molybdenum (Mo). In still another example, the second metal layer 150 may include titanium (Ti), and aluminum (Al) that is sequentially formed on the titanium (Ti). In further still another example, the gate metal film may include molybdenum (Mo), aluminum (Al) that is sequentially formed on the molybdenum (Mo), and molybdenum (Mo) that is sequentially formed on the aluminum (Al).

The second metal layer 150 is patterned using a photoresist pattern to form a second metal pattern. The second metal pattern includes a plurality of data lines DLm and DLm+1, and a source electrode SE and a drain electrode DE of the switching element TR. Then, the ohmic contact layer 142 is removed using the source and drain electrodes SE and DE to form a channel area of the switching element TR.

Figure 3F:
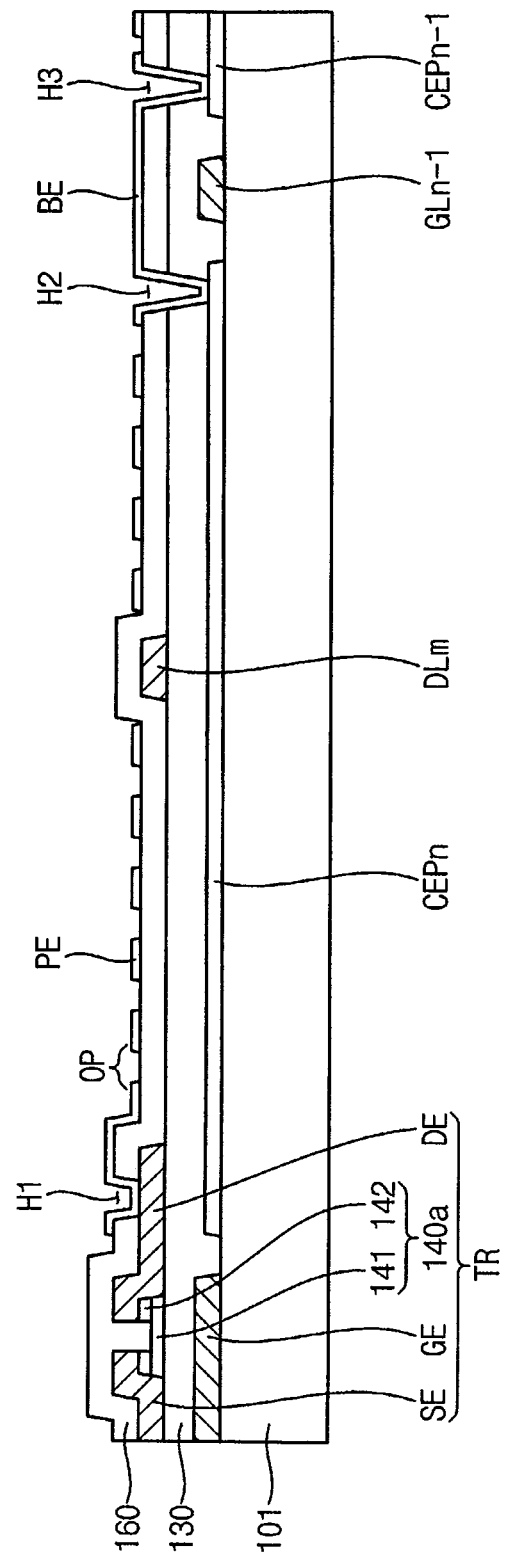

Referring to FIGS. 1 and 3F, a passivation film 160 is formed on the base substrate 101 having the second metal pattern. The passivation film 160 is etched to form a first contact hole H1 exposing the drain electrode DE. The passivation film 160 and the gate insulation layer 130 are etched to form a second and a third contact holes H2 and H3 exposing the (n)-th common electrode pattern CEPn and the (n−1)-th common electrode pattern CEPn−1, respectively.

Then, a second transparent conductive layer (not shown) is formed on the base substrate 101 having the first contract hole H1, the second contact hole H2 and the third contact hole H3. The second transparent conductive layer may include an optically transparent and electrically conductive material such as indium tin oxide (ITO), indium zinc oxide (IZO), amorphous indium tin oxide (a-ITO), etc.

The second transparent conductive layer is patterned using a photoresist pattern to form a transparent electrode pattern. The transparent electrode pattern includes a first pixel electrode PE1 and a bridge electrode BE. The first pixel electrode PE1 having a plurality of openings OP formed thereon is formed in the first pixel area P1. The first pixel electrode PE1 is electrically connected to the drain electrode DE through the first contact hole H1.

Figure 3G:
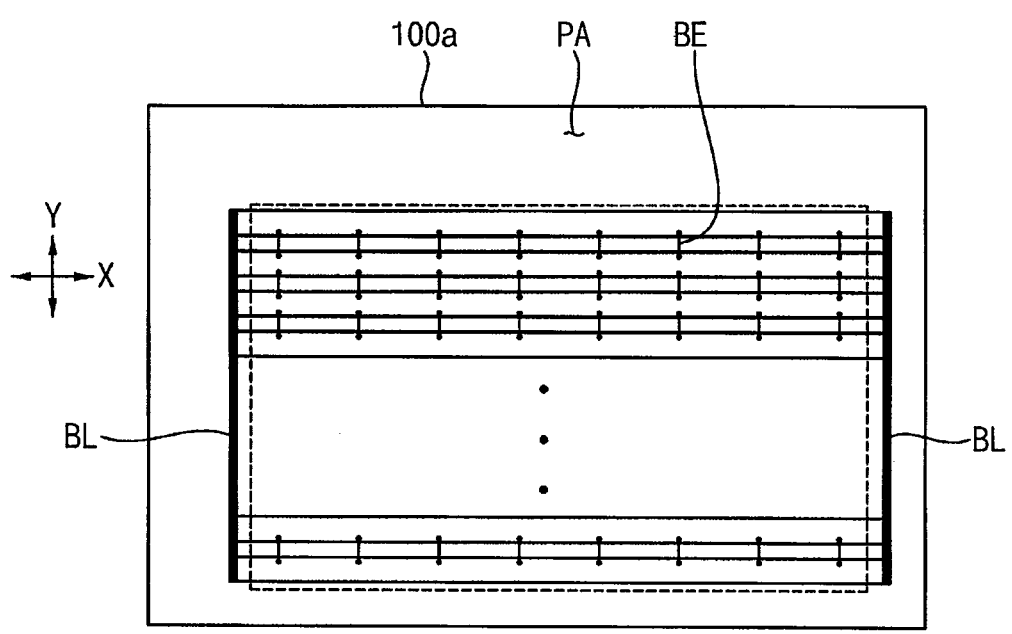

The bridge electrode BE makes electrical contact with the (n)-th common electrode pattern CEPn and the (n−1)-th common electrode pattern CEPn−1 through the second and third contact holes H2 and H3, as shown in FIG. 3G.

Hereinafter, the same reference numerals will be used to designate the same components as those described in Embodiment 1, and only brief descriptions thereof will be provided.

Embodiment 2

Figure 4:
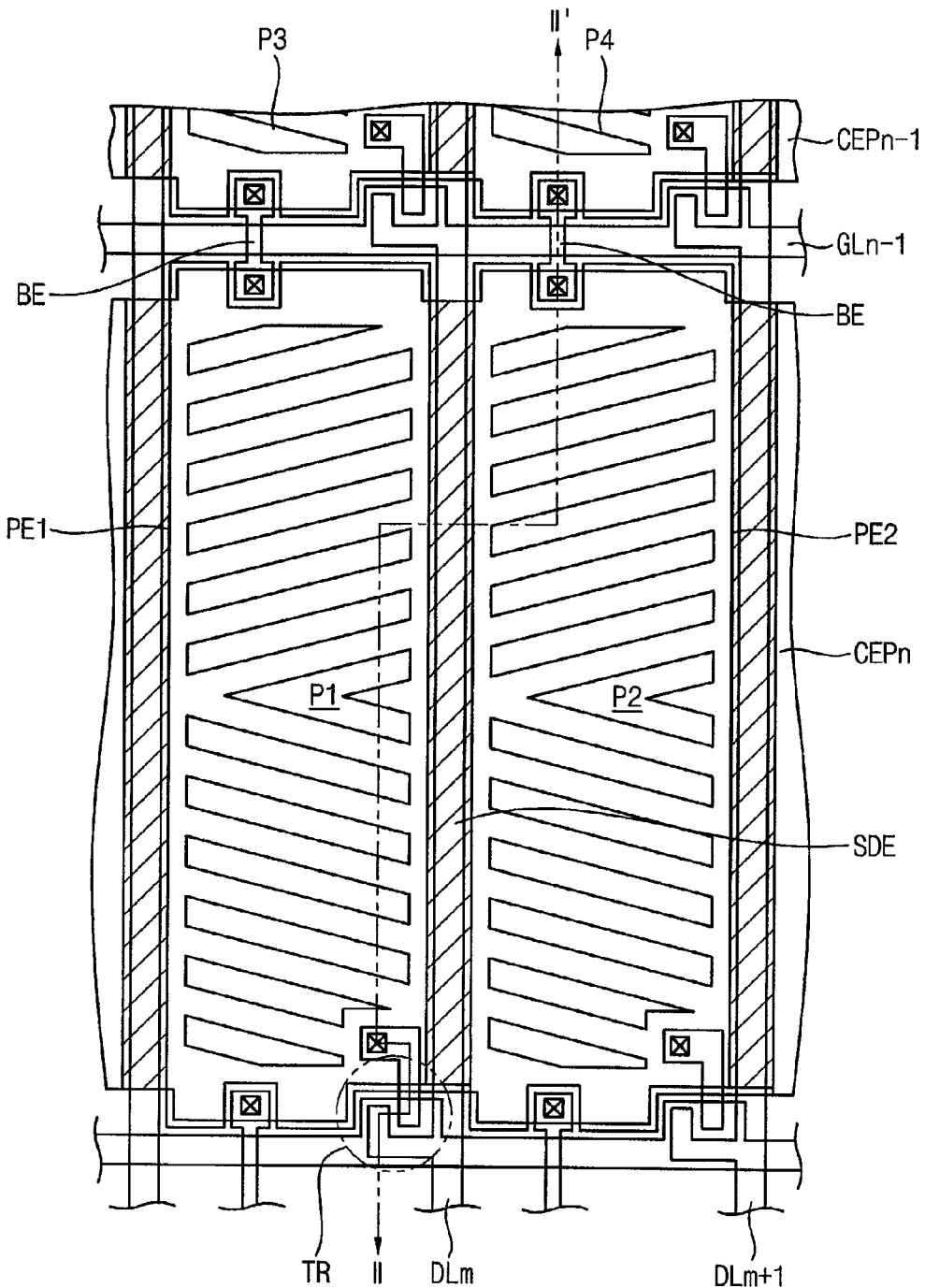
FIG. 4 is a plan view illustrating an array substrate according to another embodiment of the present invention.
Figure 5:
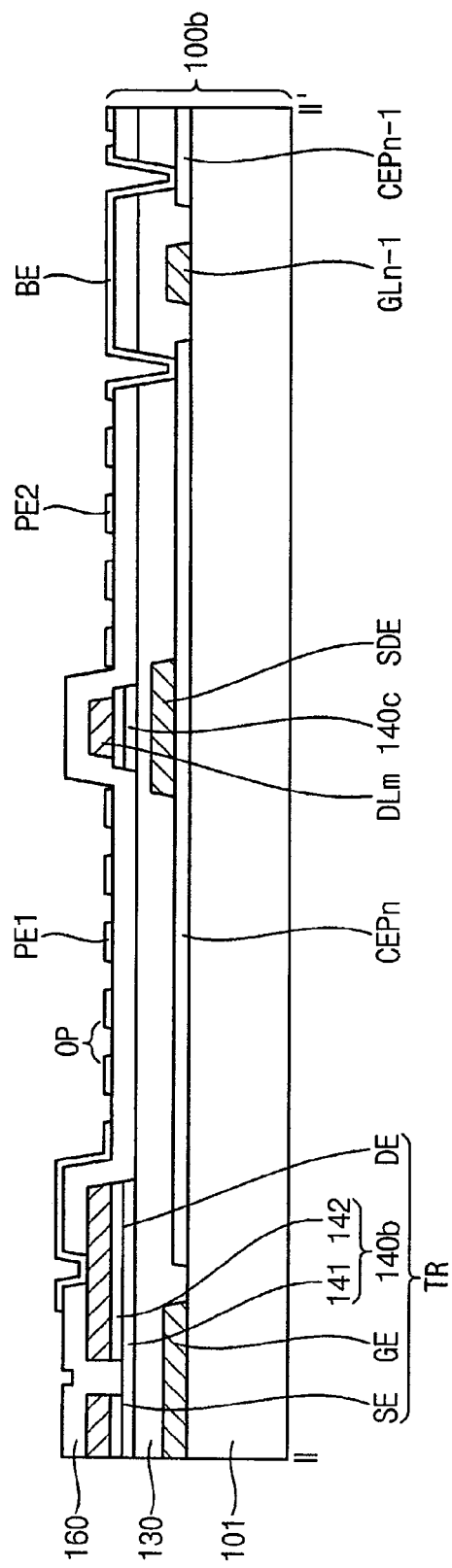
FIG. 5 is a cross-sectional view taken along a line II-II' of FIG. 4.

FIG. 4 is a plan view illustrating an array substrate according to Embodiment 2 of the present invention. FIG. 5 is a cross-sectional view taken along a line II-II' of FIG. 4.

Referring to FIGS. 4 and 5, an array substrate 100b includes a plurality of gate lines GLn−1 and GLn, a plurality of data lines DLm and DLm+1, a plurality of common electrode patterns CEPn−1 and CEPn, a shield electrode SDE, a switching element TR, a pixel electrode PE, and a bridge electrode BE.

The gate lines GLn−1 and GLn are extended in a first direction 'X'. The data lines DLm and DLm+1 are extended in a second direction 'Y' crossing the first direction 'X'. A channel pattern 140c is formed below the data lines DLm and DLm+1. The channel pattern 140 includes a semiconductor layer.

The common electrode patterns CEPn−1 and CEPn are formed in the pixel areas P1 and P2 that are arranged in the first direction 'X'. An electric field created by the common electrode pattern CEP may prevent coupling between the data line DLm and the second pixel electrode PE2 to reduce a coupling capacitance between the data line DLm and the first pixel electrode PE1. Therefore, the first pixel electrode PE1 extends to an area adjacent to the data line DLm, to enhance the aperture ratio of the array substrate.

A shield electrode SDE is formed between the common electrode patterns CEPn−1 and CEPn and the data lines DLm and DLm+1 respectively and are overlapped by the data lines DLm and DLm+1. The shield electrode SDE may block light incident through a rear surface of the base substrate 101. Thus, light may be prevented from being applied to the channel pattern 140c formed below the data lines DLm and DLm+1.

For example, when the light is provided to the array substrate 100b using a blinking method by a predetermined period, a light current may flow through the channel pattern 140c so that a waterfall phenomenon is generated in a display panel. Thus, the shield electrode SDE may block light incident to the channel pattern 140c, so that a waterfall phenomenon may be prevented. The shield electrode SDE may include an optically non-transparent material. For example, the shield electrode SDE may be formed from a gate metal layer which forms the gate lines GLn−1 and GLn.

The shield electrode SDE may prevent light leakage between the first and second pixel electrodes PE1 and PE2. Therefore, the light-blocking pattern may not be formed in an area corresponding to the data lines DLm and DLm+1 on an opposite substrate facing the array substrate 100b.

The switching element TR includes a gate electrode GE connected to the (n)-th gate line GLn, a source electrode SE connected to the (m)-th data line DLm, and a drain electrode DE spaced apart from the source electrode SE to be connected to the source electrode SE through the channel part 140b. The channel part 140b is formed below the source and drain electrodes SE and DE.

The first pixel electrode PE1 has a plurality of openings OP formed thereon. For example, the openings OP may be separated from each other. In this embodiment, the openings OP are formed in a V-shape along the first direction 'X'. Alternatively, the openings OP may have other shapes, such as a V-shape, along the second direction 'Y'. Alternatively, the openings OP may be formed in a direction parallel with the first and second directions 'X' and 'Y'.

The bridge electrode BE makes electrical contact with the common electrode patterns CEPn−1 and CEPn that are spaced apart from each other.

The opposite substrate 200 coupled to the array substrate 100a of Embodiment 1 may be applied to the display panel of Embodiment 2 and any further explanation concerning the above elements will be omitted.

Hereinafter, a method of manufacturing an array substrate 100b according to Embodiment 2 will be described in detail with reference to FIGS. 3A to 3G and FIG. 5.

Referring to FIGS. 3A and 3B, a plurality of common electrode patterns CEPn−1 and CEPn is formed in pixel areas arranged in a first direction, on a first base substrate 101. In a process of manufacturing a first metal pattern as shown in FIG. 3C, the shield electrode SDE is formed.

In a process of manufacturing a second metal pattern as shown in FIG. 3E, the channel layers 141 and 142 and the second metal layer 150 are patterned through one mask. For example, the channel layers 141 and 142 and the second metal layer 150 may be sequentially deposited on the first base substrate 101 having the first metal layer 150. Then, the channel layers 141 and 142 and the second metal layer 150 are simultaneously patterned through a photoresist pattern as a mask to form a second metal pattern. The second metal pattern includes a channel pattern. That is, a channel part 140b is formed below the source and drain electrodes SE and DE of the switching element TR, and a channel pattern 140c is formed below the data lines DLm and DLm+1. Alternatively, in the process of manufacturing the second metal pattern, the channel layer and the second metal layer may be patterned through different masks as described in the method of manufacturing the array substrate of Embodiment 1.

Then, a process of forming the pixel electrode PE and the bridge electrode BE may be substantially the same as in the description of FIGS. 3F and 3G.

Embodiment 3

Figure 6:
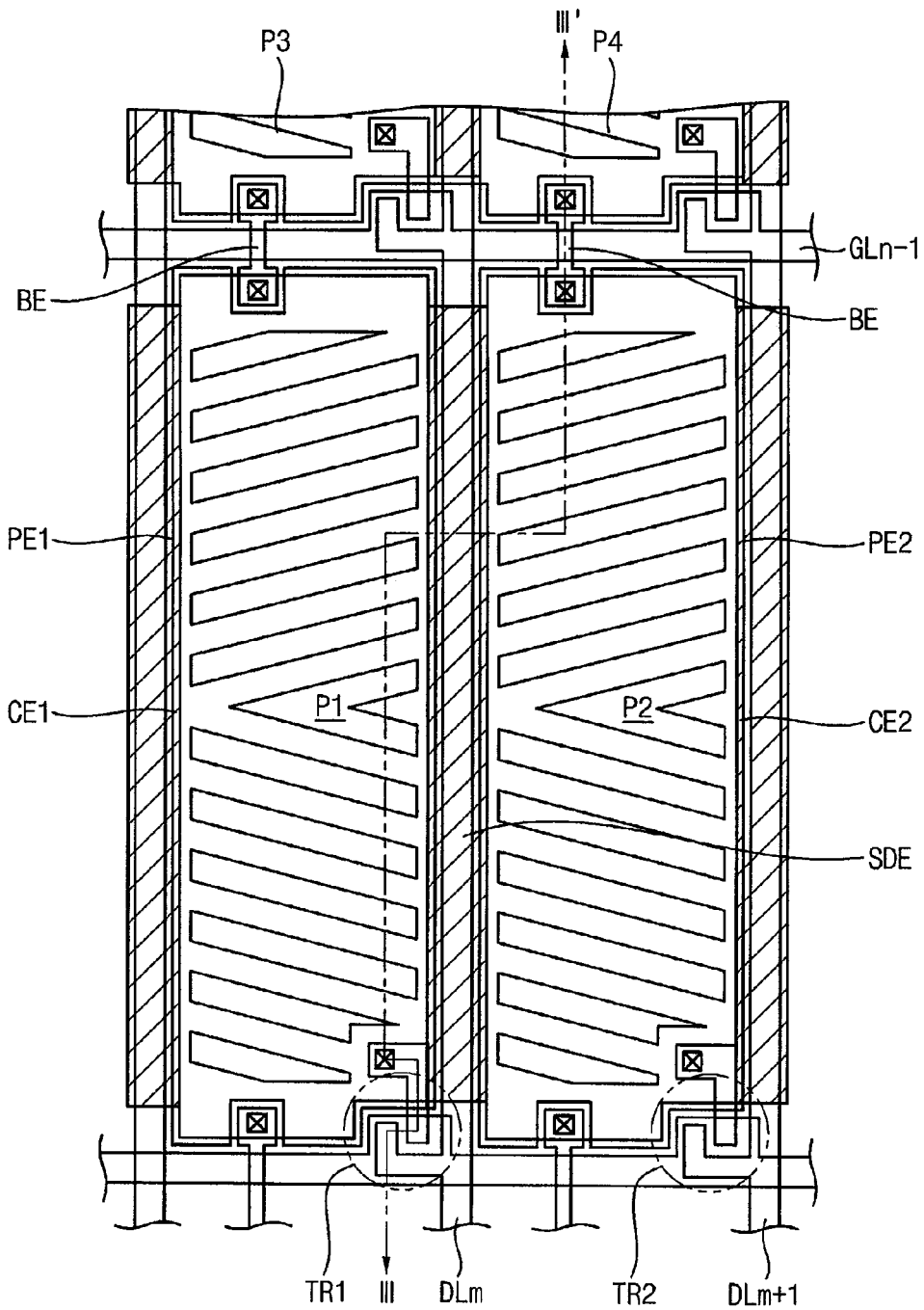
FIG. 6 is a plan view illustrating an array substrate according to still another embodiment of the present invention.
Figure 7:
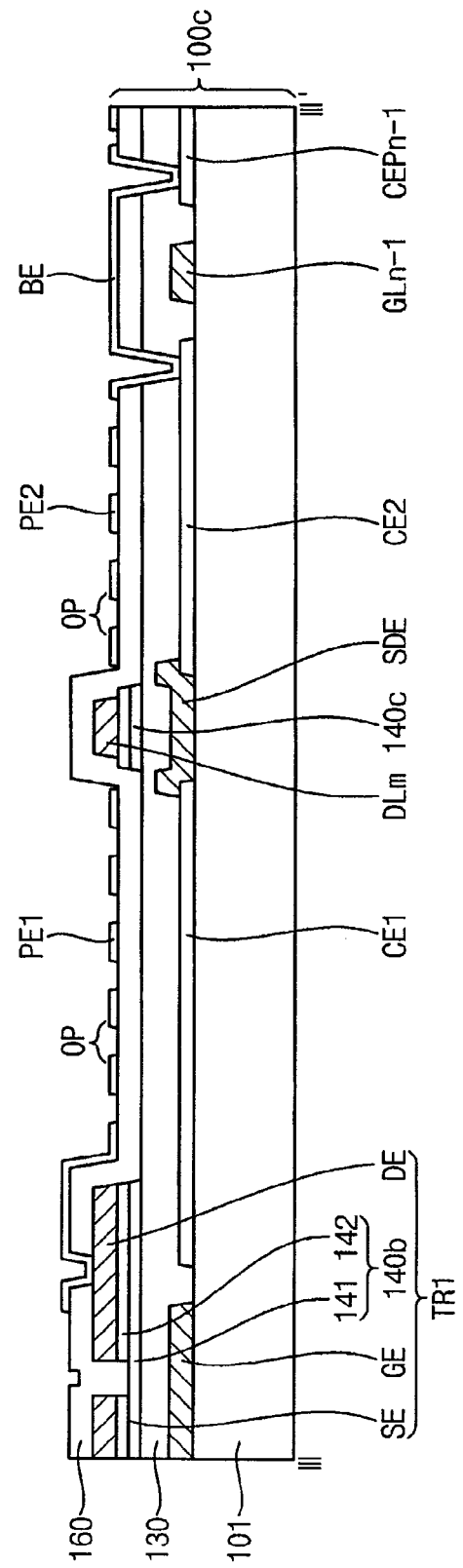
FIG. 7 is a cross-sectional view taken along a line III-III' of FIG. 6.

FIG. 6 is a plan view illustrating an array substrate according to Embodiment 3 of the present invention. FIG. 7 is a cross-sectional view taken along a line III-III' of FIG. 6.

Referring to FIGS. 6 and 7, an array substrate 100c includes a plurality of gate lines GLn−1 and GLn, a plurality of data lines DLm and DLm+1, a first switching element TR1, a second switching element TR2, a first pixel electrode PE1, a second pixel electrode PE2, a first common electrode CE1, a second common electrode CE2, a shield electrode SDE, and a bridge electrode BE.

The first switching element TR1 is electrically connected to the (n)-th gate line GLn, the (m)-th data line DLm and the first pixel electrode PE1. The first common electrode CE1 is formed below the first pixel electrode PE1 to be overlapped with the first pixel electrode PE1 in an area where the first pixel electrode PE1 is formed.

The second switching element TR2 is electrically connected to the (n)-th gate line GLn, the (m+1)-th data line DLm+1 and the second pixel electrode PE2. The second common electrode CE2 is formed below the second pixel electrode PE2 to be overlapped with the second pixel electrode PE2 in an area where the second pixel electrode PE2 is formed.

The shield electrode SDE is formed below the data lines DLm and DLm+1 to electrically contact the first and second common electrodes CE1 and CE2 adjacent to each other, so that the shield electrode SDE may reduce a coupling capacitance between the first and second pixel electrodes PE1 and PE2. Therefore, the first and second pixel electrodes PE1 and PE2 are extended to an area adjacent to the data line DL, so that the aperture ratio of the display panel may be enhanced.

The shield electrode SDE blocks light incident from a rear surface of the base substrate 101 to prevent a waterfall phenomenon from being generated. Moreover, the leakage current between the first and second pixel electrodes PE1 and PE2 may be blocked by the shield electrode SDE. The light-blocking pattern may be removed from an area corresponding to the data lines DLm and DLm+1 in the opposite substrate facing the array substrate 100c. The shield electrode SDE may include an optically non-transparent material. For example, the shield electrode SDE may be formed from a gate metal layer forming the gate lines GLn−1 and GLn.

The opposite substrate 200 coupled to the array substrate 100a of Embodiment 1 may be applied to the display panel of Embodiment 3 and any further explanation concerning the above elements will be omitted.

Hereinafter, a method of manufacturing an array substrate 100c according to Embodiment 3 will be described in detail with reference to FIGS. 3A to 3G and FIG. 7.

Referring to FIGS. 3A and 7, an optically non-transparent and electrically conductive layer is formed on the first base substrate 101, and first and second common electrodes CE1 and CE2 are formed in pixel areas P1 and P2, respectively using a photoresist pattern as a mask.

Then, in a process of manufacturing the first metal pattern as shown in FIG. 3C, a shield electrode SDE is formed, which is electrically connected to the common electrodes P1 and P2 that are arranged in a first direction.

A second metal pattern and a pixel electrode PE may be formed on a first base substrate 101 having the shield electrode SDE through the forming process as described in Embodiment 2. Alternatively, the second metal pattern and the pixel electrode PE may be formed through the forming process as described in Embodiment 1.

Figure 8A:
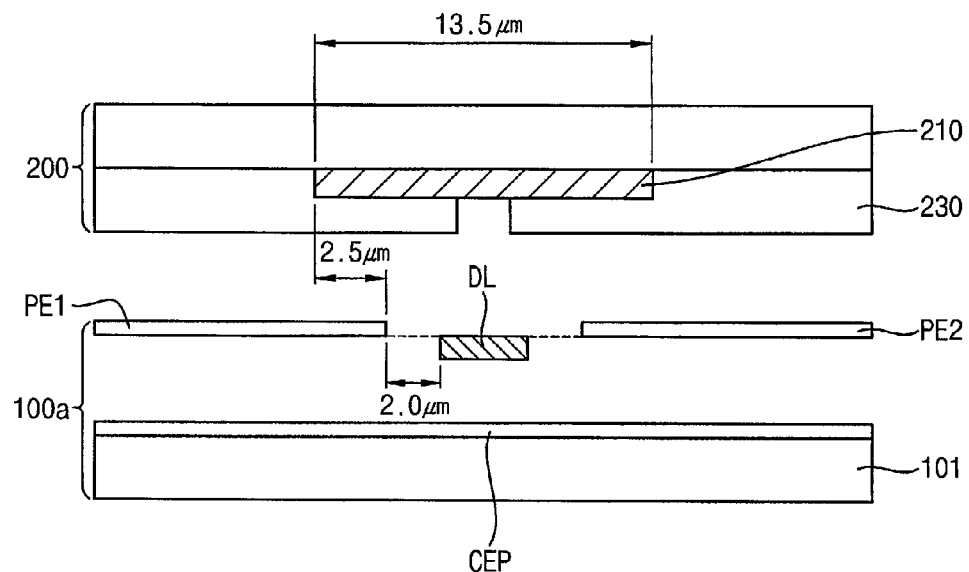
FIGS. 8A to 8C are cross-sectional views illustrating display panels according to samples manufactured in accordance with embodiments of the present invention.
Figure 8B:
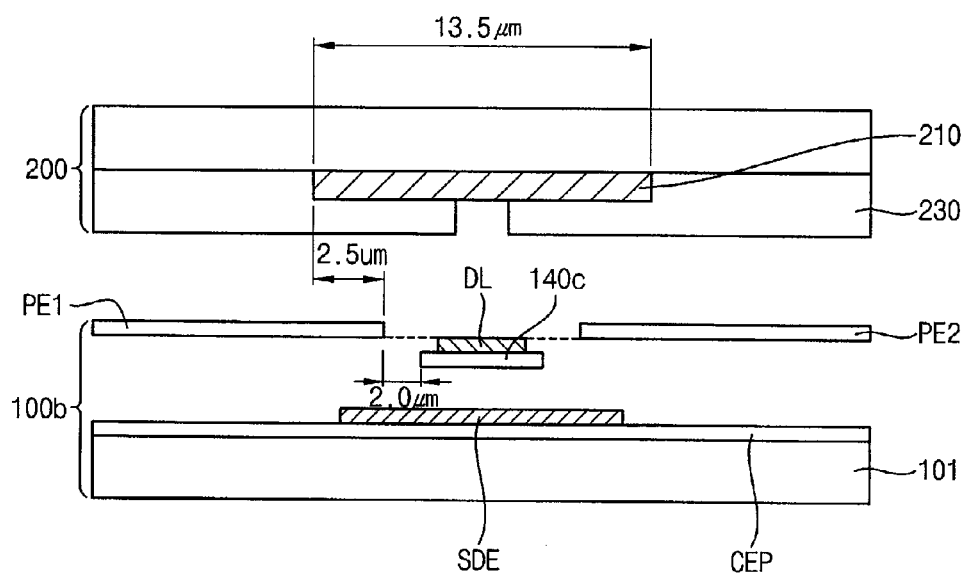
Figure 8C:
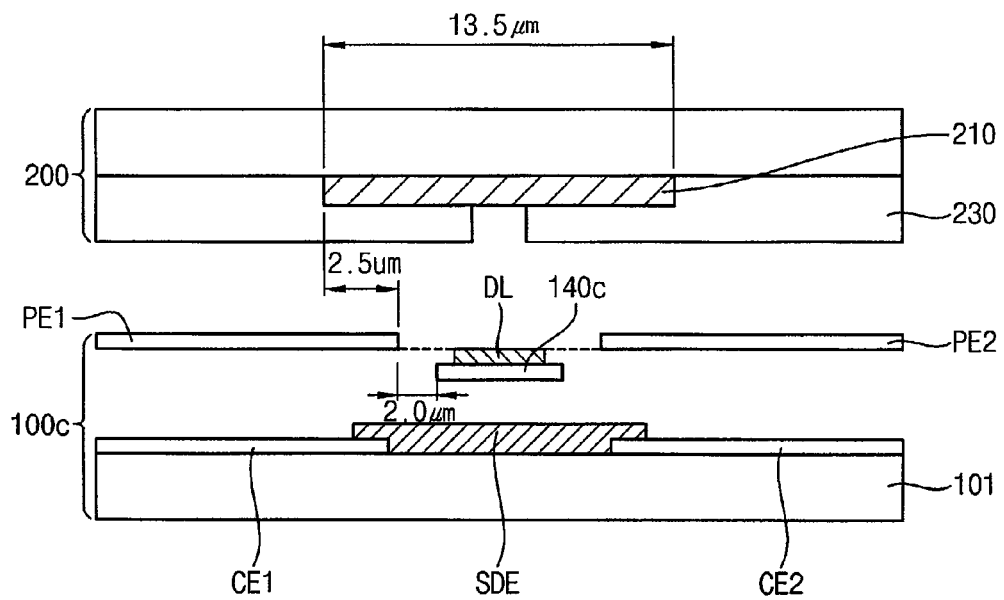

FIGS. 8A to 8C are cross-sectional views illustrating display panels according to samples manufactured in accordance with embodiments of the present invention.

FIG. 8A is a cross-sectional view illustrating a display panel according to a first sample manufactured in accordance with one embodiment of the present invention. Referring to FIG. 8A, a common electrode pattern CEP is formed in pixel areas of an array substrate 100a according to a first sample, and a data line DL is formed on the common electrode pattern CEP. First and second pixel electrodes PE1 and PE2 are formed in the pixel areas to be spaced apart from the data line DL. In detail, the data line DL is spaced apart from the first pixel electrode PE1 by about 2.0 μm, and the data line DL is spaced apart from the second pixel electrode PE2 by about 2.0 μm. That is, to describe the coupling between the first and second pixel electrodes PE1 and PE2 and the data line DL was decreased by the common electrode pattern CEP, a distance between the data line DL and the first pixel electrode PE1 is about 2.0 μm and a distance between the data line DL and the second pixel electrode PE2 is about 2.0 μm.

Since the distances between the data line DL and the first and second pixel electrodes PE1 and PE2 are both about 2.0 μm, the light-blocking pattern 210 is formed on the opposite substrate to be overlapped with edges of the first and second pixel electrode PE1 and PE2 by about 2.5 μm in order to block the leakage light from an interval area. A width of the light-blocking pattern 210 is about 13.5 μm.

FIG. 8B is a cross-sectional view illustrating a display panel according to a second sample manufactured in accordance with another embodiment of the present invention. Referring to FIG. 8B, a common electrode pattern CEP is formed on an array substrate 100b of the first sample, a shield electrode SDE is formed on the common electrode pattern CEP, and a data line DL is formed on the shield electrode SDE.

Then, the first and second pixel electrodes PE1 and PE2 are formed in pixel areas to be both spaced apart from the data line DL. In detail, the data line DL is spaced apart from the first pixel electrode PE1 by about 2.0 μm, and the data line DL is spaced apart from the second pixel electrode PE2 by about 2.0 μm. That is, to decrease the coupling between the first and second pixel electrodes PE1 and PE2 and the data line DL by the common electrode pattern CEP, a distance between the data line DL and the first pixel electrode PE1 is about 2.0 μm and a distance between the data line DL and the second pixel electrode PE2 is about 2.0 μm, identical to the first sample. A width of the light-blocking pattern 210 is about 13.5 μm.

FIG. 8C is a cross-sectional view illustrating a display panel according to a third sample manufactured in accordance with still another embodiment of the present invention. Referring to FIG. 8C, common electrodes CE1 and CE2 are independently formed in pixel areas of an array substrate 100c according to a third sample. A shield electrode SDE is formed in an interval area of the first and second common electrodes CE1 and CE2. Two edges of the shield electrode SDE are overlapped with the first and second common electrodes CE1 and CE2 to be electrically connected to the first and second common electrodes CE1 and CE2.

The shield electrode SDE may reduce coupling between the data line DL and the first and second pixel electrodes PE1 and PE2. A distance between the data line DL and the first pixel electrode PE1 is about 2.0 μm and the distance between the data line DL and the second pixel electrode PE2 is about 2.0 μm, identical to the first sample. The width of a light-blocking pattern 210 formed on the opposite substrate 200 is about 13.5 μm.

Figure 8D:
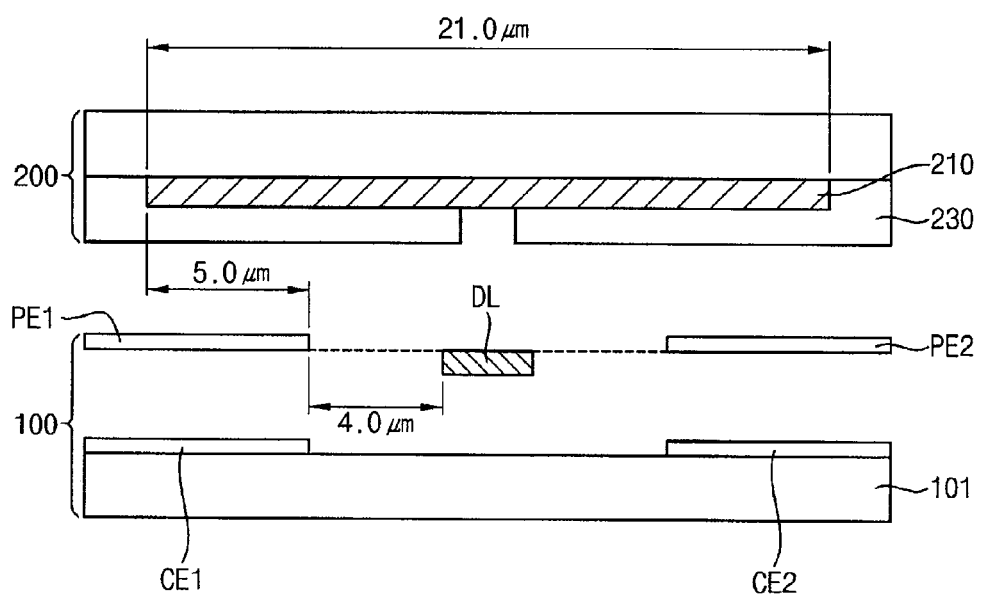
FIG. 8D is a cross-sectional view illustrating a display panel according to a conventional art.

FIG. 8D is a cross-sectional view illustrating a display panel as a Comparative Sample according to a conventional art.

Referring to FIG. 8D, in the Comparative Sample, the first and second common electrodes CE1 and CE2 are formed in pixel areas P1 and P2 adjacent to each other, a data line DL is formed in an interval area of the first and second common electrodes CE1 and CE2, and first and second pixel electrodes PE1 and PE2 are formed on the first and second common electrodes CE1 and CE2. A light-blocking pattern 210 is formed in correspondence with the data line DL on an opposite substrate 200 facing the array substrate 100.

According to the display panel in FIG. 8D, coupling is generated between the first and second common electrodes CE1 and CE2 and the data line DL, and coupling is generated between the first pixel electrode PE1 and the second pixel electrode PE2. Accordingly, the data line DL is spaced apart from the first and second common electrodes CE1 and CE2 by about 4.0 μm in order to minimize the effects of coupling. Moreover, the data line DL is spaced apart from the first and second pixel electrodes PE1 and PE2 by about 4.0 μm in order to minimize the effects of coupling.

In order to block light leakage from an interval area between the data line DL and the first and second pixel electrodes PE1 and PE2, the light-blocking pattern 210 should be formed on the opposite substrate 100 to be overlapped with edges of the first and second pixel electrodes PE1 and PE2 by about 5.0 μm. Therefore, a width of the light-blocking pattern 210 is about 21.0 μm.

The following Table 1 represents data of the first to third samples as shown in FIGS. 8A to 8C and the Comparative Sample as shown in FIG. 8D.

TABLE 1

| | Sample 1 | Sample 2 | Sample 3 | Comparative Sample |
|---|---|---|---|---|
| DL_PE | 2.0 μm | 2.0 μm | 2.0 μm | 4.0 μm |
| PE_LB | 2.5 μm | 2.5 μm | 2.5 μm | 4.0-4.5 μm |
| Width of a light-blocking pattern | 13.5 μm | 13.5 μm | 13.5 μm | 21.0 μm |
| Aperture ratio | 56% | 56% | 56% | 47% |

Referring to Table 1, each of the intervals (DL_PE) between the data line and the pixel electrode of the first to third samples is narrowed in comparison to that of the Comparative Sample. Moreover, each of the overlapped widths (PE_LB) between the pixel electrode and the light-blocking pattern was narrowed in comparison to that of the Comparative Sample. Therefore, each of the widths of the light-blocking patterns of the first to third samples is also smaller than that of the Comparative Sample.

In detail, the intervals (DL_PE) between the data line and the pixel electrode of the first to third samples are each about 2.0 μm; in contrast, the DL_PE of the Comparative Sample is about 4.0 μm. Moreover, the overlapped widths (PE_LB) between the pixel electrode and the light-blocking pattern of the first to third samples are each about 2.5 μm; in contrast, the PE_LB of the Comparative Sample is about 4.0 μm to about 4.5 μm. Accordingly, the widths of the light-blocking patterns of the first to third samples are about 13.5 μm; in contrast, that the width of the light blocking pattern of the Comparative Sample was about 21.0 μm.

As a result, the widths of the light-blocking pattern of the first to third samples are narrowed in comparison to that of the Comparative Sample, so that aperture ratios of the first to third samples are greater than that of the Comparative Sample. That is, the aperture ratios of the samples are each about 56%; however, that of the Comparative Sample is about 47%. Therefore, the aperture ratios of the samples are increased by about 10% in comparison with that of the Comparative Sample.

In the above described samples, the light-blocking pattern was formed on the opposite substrate. Alternatively, the light-blocking pattern may be removed from the opposite substrate. That is, when the shield electrode SDE including an optically non-transparent material is formed on the array substrate, the light-blocking pattern may be removed from the opposite substrate. In this case, the aperture ratio may be increased to be greater than about 56%.

As described above, according to the embodiments of the present invention, a common electrode pattern is formed on an array substrate to prevent coupling from being generated between a data line and a pixel electrode of the common electrode pattern, so that a distance between the pixel electrode and the data line may be minimized, and thus an aperture ratio may be enhanced.

Moreover, a shield electrode including an optically non-transparent material is formed below the data line, reducing coupling between the data line and the pixel electrode. Furthermore, the shield electrode may block light incident to a channel pattern formed below the data line, preventing a waterfall phenomenon. As the shield electrode is formed on the array substrate, the light-blocking pattern may be removed in an area corresponding to the data line on an opposite substrate facing the array substrate. As a result, an aperture ratio of a display panel may be enhanced.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An array substrate comprising:
    a base substrate;
    a gate line extended along a first direction on the base substrate;
    a data line extended along a second direction crossing the first direction;
    a common electrode formed in a pixel area of the base substrate;
    a pixel electrode having a plurality of openings formed thereon; and
    a shield electrode formed overlapping the data line and on the common electrode, and contacting the common electrode,
    wherein the common electrode is overlapped by the entirety of the openings of the pixel electrode.

2. The array substrate of claim 1, further comprising a bridge electrode electrically connecting common electrodes adjacent to each other in the second direction.

3. The array substrate of claim 2, wherein the bridge electrode and the pixel electrode are formed from the same material.

4. The array substrate of claim 1,
    wherein the common electrode is overlapped by a pixel electrode in another pixel area adjacent to the pixel electrode.

5. The array substrate of claim 1, wherein a same level of voltage is applied to the shield electrode and the plurality of common electrodes.

6. The array substrate of claim 5,
    wherein the shield electrode and the common electrodes are formed from the same material.

7. The array substrate of claim 5,
    wherein the shield electrode partially overlaps the pixel electrode.

8. The array substrate of claim 5,
    wherein the common electrodes being spaced apart from each other.

9. The array substrate of claim 8,
    wherein a width of the shield electrode is larger than a gap between two adjacent common electrodes.

10. The array substrate of claim 5, wherein the shield electrode and the gate line are formed from the same material.

11. The array substrate of claim 5, further comprising a semiconductor layer formed between the data line and the shield electrode.

12. The array substrate of claim 5, wherein the plurality of common electrodes comprise a common electrode pattern commonly formed in a plurality of pixel areas arranged in the first direction.

13. The array substrate of claim 12, wherein the shield electrode is overlapped with the common electrode pattern and contacts the common electrode pattern.

14. The array substrate of claim 13, further comprising a semiconductor layer formed between the data line and the shield electrode.

15. The array substrate of claim 5, wherein the shield electrode and the common electrode are integrally formed.

16. The array substrate of claim 1, further comprising a bridge electrode electrically connecting the common electrodes adjacent to each other.

17. The array substrate of claim 1, wherein the data line is not overlapped by the pixel electrode.

18. A display panel comprising:
    an array substrate including:
        a base substrate;
        a gate line extended along a first direction on the base substrate;
        a data line extended along a second direction crossing the first direction;
        a common electrode formed in a pixel area of the base substrate, a pixel electrode having a plurality of openings formed thereon; and
        a shield electrode formed overlapping the data line and on the common electrode, and contacting the common electrode;
    and
    an opposite substrate coupled to the array substrate; and
    wherein the common electrode is overlapped by the entirety of the openings of the pixel electrode.

19. The display panel of claim 18, wherein the opposite substrate comprises a color filter formed in correspondence with each of the pixel areas.

20. The display panel of claim 18, wherein the opposite substrate comprises a light-blocking pattern formed in an area in correspondence with the gate and data lines.

21. The display panel of claim 18, wherein the opposite substrate comprises a light-blocking pattern formed in correspondence with the gate line, the light-blocking pattern being removed in an area in correspondence with the data line.

22. The display panel of claim 18, wherein the array substrate further comprises a bridge electrode electrically connecting common electrodes adjacent to each other in the second direction.

23. The display panel of claim 18,
    wherein a same level of voltage is applied to the shield electrode and the plurality of common electrodes.

24. The display panel of claim 23, wherein the shield electrode and the common electrodes are formed from the same material.

25. The display panel of claim 23, wherein the shield electrode is formed from an optically non-transparent and electrically conductive material.

26. The display panel of claim 23, wherein the shield electrode and the gate line are formed from a same material.

27. The display panel of claim 23, wherein the plurality of common electrodes comprises a common electrode pattern commonly formed in a plurality of pixel areas arranged in the first direction.

28. The display panel of claim 27, wherein the opposite substrate comprises a light-blocking pattern formed in correspondence with the gate line, the light-blocking pattern being removed in an area in correspondence with the data line.

29. The display panel of claim 18, wherein the data line is not overlapped by the pixel electrode.

30. An array substrate comprising:
    a gate line extended along a first direction on a base substrate;
    a data line extended along a second direction crossing the first direction;
    a common electrode formed in a pixel area of the base substrate;
    a pixel electrode overlapped with the common electrodes, the pixel electrode having a plurality of openings formed thereon; and
    a shield electrode formed overlapping the data line and on the common electrode, and contacting the common electrode,
    wherein the common electrode is overlapped by the entirety of the openings of the pixel electrode.

31. The array substrate of claim 30, wherein the data line is not overlapped by the pixel electrode.

* * * * *